United States Patent
Hicks et al.

(10) Patent No.: US 11,289,852 B2
(45) Date of Patent: Mar. 29, 2022

(54) DETECTING CABLE MOVEMENT IN PHYSICAL PORTS

(71) Applicant: International Business Machines Corporation, Armonk, NY (US)

(72) Inventors: Andrew C. M. Hicks, Wappingers Falls, NY (US); Ryan Thomas Rawlins, New Paltz, NY (US); Christopher V. DeRobertis, Hopewell Junction, NY (US); Khaalid Persaud Juggan McMillan, Wappingers Falls, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 157 days.

(21) Appl. No.: 16/784,406

(22) Filed: Feb. 7, 2020

(65) Prior Publication Data
US 2021/0249818 A1 Aug. 12, 2021

(51) Int. Cl.
*H01R 13/641* (2006.01)
*H01R 24/58* (2011.01)

(52) U.S. Cl.
CPC ........... *H01R 13/641* (2013.01); *H01R 24/58* (2013.01)

(58) Field of Classification Search
CPC ............................. H01R 13/641; H01R 24/58
See application file for complete search history.

(56) References Cited

U.S. PATENT DOCUMENTS

| | | | |
|---|---|---|---|
| 4,905,518 A | 3/1990 | Kubler | |
| 8,360,801 B2 | 1/2013 | Lynch et al. | |
| 8,814,445 B2* | 8/2014 | Gallegos | G02B 6/3879 |
| | | | 385/89 |
| 9,130,945 B2 | 9/2015 | Smith et al. | |
| 9,482,820 B1* | 11/2016 | Barwicz | G02B 6/4242 |
| 9,696,497 B1* | 7/2017 | Barwicz | G02B 6/3825 |
| 9,965,655 B1* | 5/2018 | Null | G06F 21/86 |
| 9,989,721 B2* | 6/2018 | Barwicz | G02B 6/3878 |
| 10,228,525 B2* | 3/2019 | Barwicz | G02B 6/4267 |
| 10,916,889 B1* | 2/2021 | Hicks | G06F 21/31 |

(Continued)

OTHER PUBLICATIONS

Anonymous, "Jiggle", URL:<https://www.dictionary.com/browse/jiggle>, online retrieved May 23, 2019, 3 pages.

(Continued)

*Primary Examiner* — Abdullah A Riyami
*Assistant Examiner* — Nader J Alhawamdeh
(74) *Attorney, Agent, or Firm* — Cantor Colburn LLP; Teddi Maranzano

(57) ABSTRACT

A cable assembly is provided. The cable assembly includes a cable element, a plug element to which a terminal end of the cable element is connected and which is configured to be plugged into a plug receptor, a sensor and an analysis engine. The sensor is disposed along the cable element or in the plug element and is configured to sense a manipulation of at least one of the cable element and the plug element relative to the plug receptor and to issue signals indicative of sensing results. The analysis engine is receptive of the signals and is configured to analyze the signals to determine a type of the manipulation and to determine whether to take an action responsive to the manipulation.

19 Claims, 12 Drawing Sheets

(56) References Cited

U.S. PATENT DOCUMENTS

| | | | | |
|---|---|---|---|---|
| 2009/0231123 A1* | 9/2009 | Rowell | ............... | G05B 23/027 |
| | | | | 340/532 |
| 2014/0016902 A1* | 1/2014 | Pepe | ...................... | H01R 24/64 |
| | | | | 385/76 |
| 2015/0094868 A1* | 4/2015 | Diab | .................. | G05B 19/4185 |
| | | | | 700/286 |
| 2015/0295355 A1* | 10/2015 | Temmesfeld | ........... | B60L 53/16 |
| | | | | 439/304 |
| 2020/0217442 A1* | 7/2020 | Parlane | ................... | F16L 55/40 |
| 2021/0036463 A1* | 2/2021 | Hicks | ...................... | G06F 21/31 |

OTHER PUBLICATIONS

Anonymous, "What is an Accelerometer?", URL:<https://www.omega.com/en-us/resources/accelerometers>, Aug. 28, 2018, 4 pages.
Anonymous, "Wiggle", URL:<https://www.dictionary.com/browse/wiggling?s-ts>, online retrieved May 23, 2019, 8 pages.
Goodrich, "Accelerometers: What they are & how they work", URL:<https://www.livescience.com/40102-accelerometers.html>, Oct. 1, 2013, 5 pages.
Savage, "What Do Accelerometers Measure?", May 8, 2005, 5 pages.
Toni_K, "Accelerometer Basic", URL:<https://learn.sparkfun.com/tutorials/accelerometer-basics/all>, Retrieved Nov. 26, 2019, 6 pages.

\* cited by examiner

DETECTING CABLE MOVEMENT IN PHYSICAL PORTS

BACKGROUND

The present invention generally relates to computing resources, and more specifically, to a method of detecting cable movement in physical ports of devices, such as information technology (IT) devices.

Modern cloud service providers and data centers include large numbers of IT devices, computers and other similar components that are housed in large facilities. Within those facilities, various cables are connected to each of the computers to allow for the computers to receive power and to communicate various types of data with each other and with external devices.

SUMMARY

Embodiments of the present invention are directed to a cable assembly. A non-limiting example of the cable assembly includes a cable element, a plug element to which a terminal end of the cable element is connected and which is configured to be plugged into a plug receptor, a sensor and an analysis engine. The sensor is disposed along the cable element or in the plug element and is configured to sense a manipulation of at least one of the cable element and the plug element relative to the plug receptor and to issue signals indicative of sensing results. The analysis engine is receptive of the signals and is configured to analyze the signals to determine a type of the manipulation and to determine whether to take an action responsive to the manipulation.

Embodiments of the present invention are directed to an information technology (IT) device assembly. A non-limiting example of the IT device assembly includes a cable assembly and an IT device. The IT device includes a printed circuit board (PCB), a heat sink coupled to the PCB and a plug receptor. The plug receptor is connected to the PCB and is receptive of a plug element of the cable assembly. The IT device assembly further includes at least one of a first sensor disposed on the cable and a second sensor disposed on the heat sink, each of which is configured to sense a manipulation of the cable relative to the plug receptor and to issue signals indicative of sensing results and an analysis engine which is receptive of the signals and configured to analyze the signals to determine a type of the manipulation and to determine whether to take an action responsive to the manipulation.

Embodiments of the present invention are directed to a method of detecting cable movement in a physical port of an information technology (IT) device. A non-limiting example of the method includes sensing a manipulation of a cable relative to a plug receptor of the IT device, analyzing data associated with results of the sensing to identify a type of the manipulation, determining an action responsive to the type of the manipulation and judging whether to take the action responsive to the type of the manipulation.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
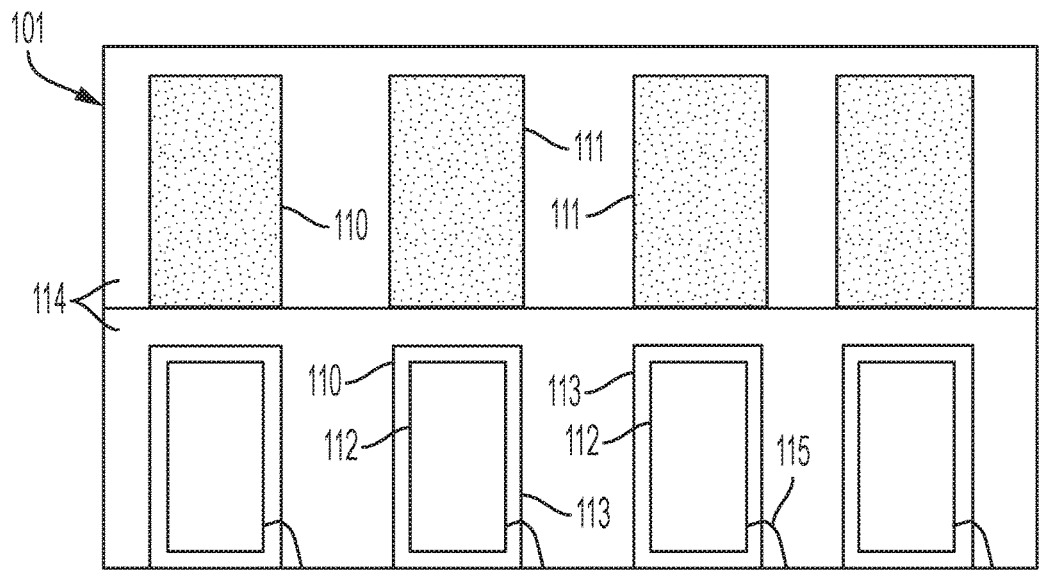
FIG. 1 illustrates a schematic illustration of a system of computing resources in accordance with embodiments of the present invention.

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

One or more embodiments of the present invention provide systems and methods for detecting cable movement in physical ports of information technology (IT) devices.

In modern cloud service providers and data centers, large numbers of IT devices, computers and other similar components are housed in large facilities. Within those facilities, various cables are connected to each of the computers to allow for the computers to receive power and to communicate various types of data with each other and with external devices. The connections of each of these and other cables to the IT devices and computers need to be frequently inspected and sometimes serviced, repaired or replaced. While this is time consuming and can result in malfunctions in an event one or more connections are handled incorrectly or at inappropriate times, it is often necessary to insure that the IT devices and computers are operated properly and without failures.

Even with proper inspections, service and repairs or replacements being executed correctly, it is possible that cable connections can be mishandled. Authorized personnel can make mistakes or accidentally trip over exposed wires. Unauthorized personnel can try to intentionally pull cable connections apart.

One or more embodiments of the present invention provide for systems and methods for detecting cable movement in physical ports of information technology (IT) devices. Physical ports (jacks) on IT devices can be equipped with accelerometers that are configured to detect when cables plugged into the ports are wiggled, jiggled, shaken, tugged, pulled or pushed. The accelerometers would send signals to an analysis engine for processing. These signals can include, but are not limited to, a universally unique identification (ID) associated with the physical port (e.g., a UUID) and data related to what is being measured (e.g., acceleration, time rate of change of velocity, etc.) and can be transmitted via wired (e.g., Ethernet, FICON, etc.) or wireless (e.g., WiFi, Bluetooth, etc.) networks. The analysis engine can run inside an embedded device (e.g., inside an IoT or other IT device), a stand-alone computing device (e.g., a hardware appliance), as a software application that can run in general purpose operating systems or as a software application that runs in dedicated hardware or systems management stations (e.g., IBM Z™ Hardware Management Console, IBM Z™ Service Element, etc.). The analysis engine analyzes the signals against predefined rules-with-actions or criteria-with-actions and associated actions would be taken by the analysis engine based on results of the analysis. For example, when the analysis engine detects that wiggling has occurred (e.g., sensors detect a certain number of left-right movements in a certain time), the analysis engine can send a message to a specified contact indicating that physical cable tampering has occurred.

As used herein, an "IT device" includes, but is not limited to, computers, servers, Internet of Things (IOT) devices, mobile devices (e.g., tablets, smartphones, laptops, etc.), networking switches, etc.

Turning now to FIG. 1, a system 101 is generally shown in accordance with one or more embodiments of the present invention. The system 101 includes one or more computing or securable resources (hereinafter referred to as "computing resources") 110. The system 101 could be provided as a cloud service, a shared data center, etc. in any case, each computing resource 110 can be provided as a safe 111, a server 112 that is housed in a rack 113 or another similar feature. The safe 111 can be controlled and monitored through software based mitigation systems. All requests to access the resources within the safe 111 would need to be registered and authenticated before the attempt would be approved or denied. If a user wished to unlock the safe 111, they would need to pass proper identification, such as a fingerprint, PIN code, etc., to a controller which would then evaluate the information and open the lock should the user possess the correct authority.

As shown in FIG. 1, the computing resources 110 can be, but are not required to be, arranged in rows and columns across one or more floors 114. In each row or column, each of the computing resources 110 can be coupled to one or more cables 115. The cables 115 can include, but are not limited to, communication cables and power cables and can carry various signals, such as power signals, data signals, etc.

Figures 2, 3:
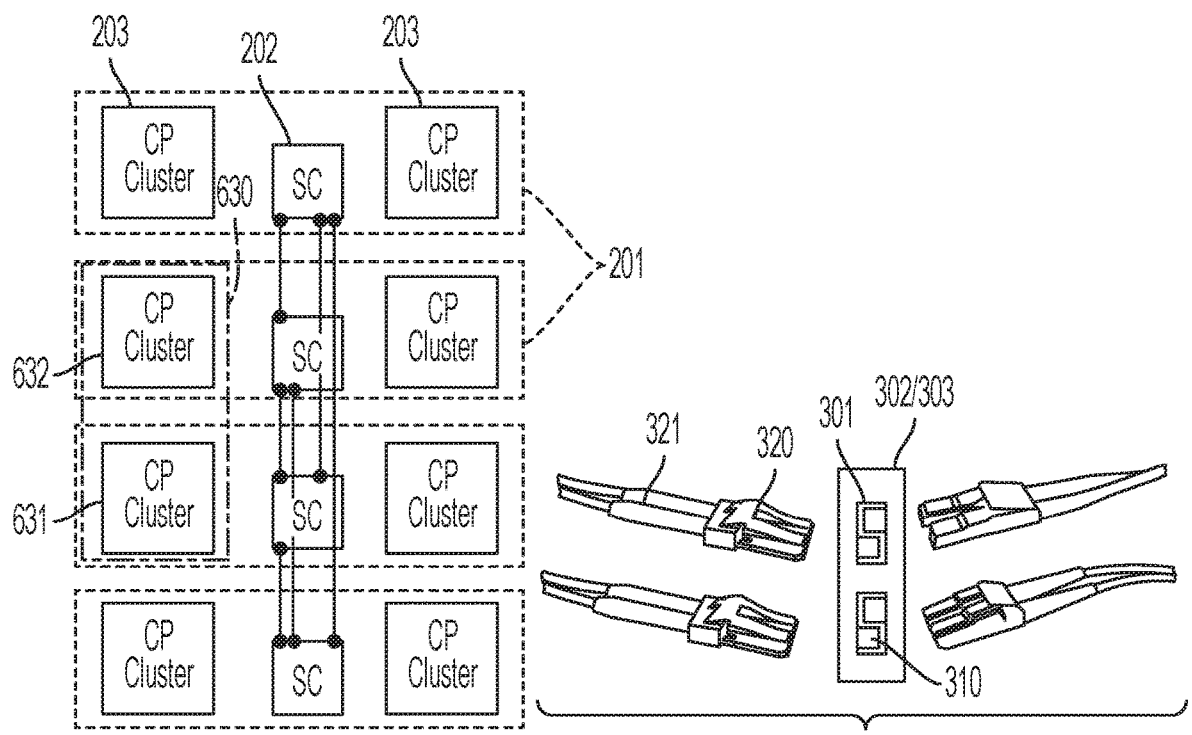
FIG. 2 illustrates a schematic diagram of components of the computing resources of FIG. 1 in accordance with embodiments of the present invention.
FIG. 3 is a schematic illustration of ports of the computing resources of FIG. 1 in accordance with embodiments of the present invention.

With reference to FIG. 2, each of the computing resources 110 can include a set of drawers 201 where each drawer 201 can include a service processor (SP) 202 and one or more central processors (CPs) 203 that are communicative with the SP 202. Each SP 202 of each drawer 201 can be interconnected with the SPs 202 of the other drawers 201 and each CP 203 of each drawer 201 can be communicative with memory units and can form a logical cluster alone or in combination with other CPs 203.

With continued reference to FIG. 2 and with additional reference to FIG. 3, one or more of the drawers 201 of each computing resource 110 can include one or more ports 301, storage devices 302 and communications, memory or peripheral cards 303. The ports 301 can provide direct or indirect access to the storage devices 302 and the communications, memory and peripheral cards 303. Each of the ports 301 can be provided as a plug receiver 310 that a plug 320 of a cable 321 can be plugged into. The cable 321 can be provided as one or more of a power cable, an Ethernet cable, a fiber optic cable, a telecommunications cable, etc., such that the cable 321 can effectively be plugged into the computing resource 110.

Figure 4:
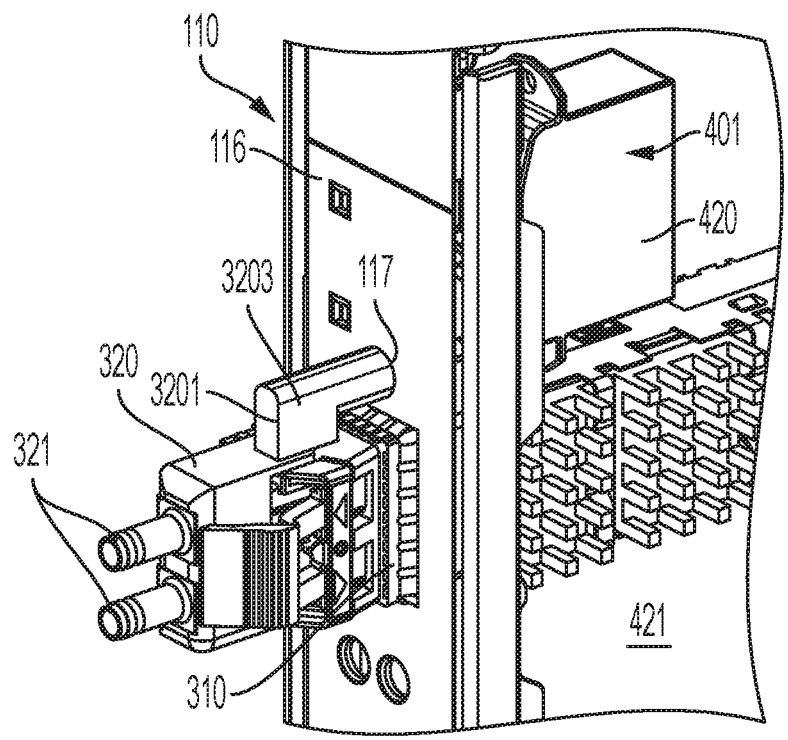
FIG. 4 is a perspective view of a cable and a locking element of computing resources in accordance with embodiments of the present invention.
Figure 5:
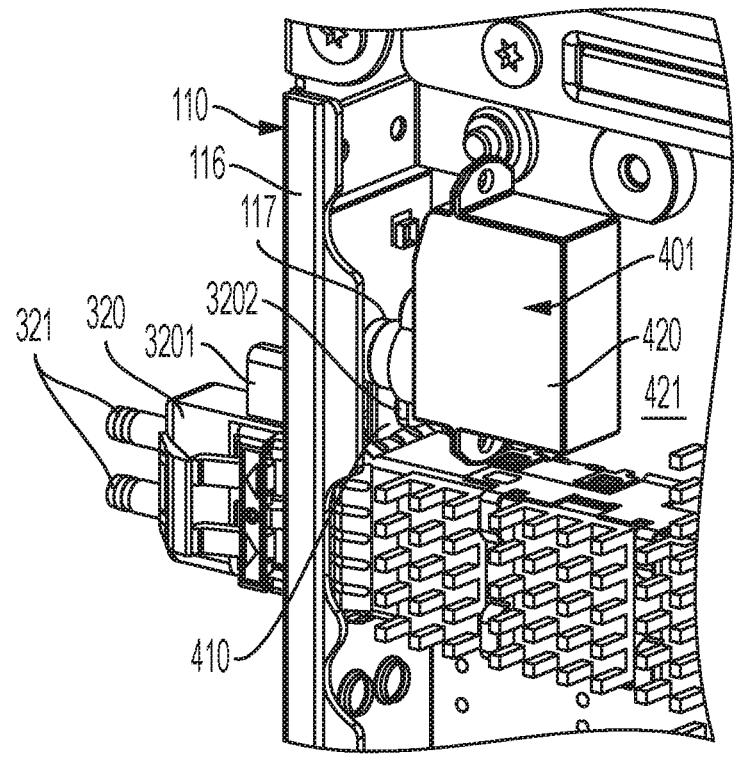
FIG. 5 is another perspective view of the cable and the locking element of FIG. 4 in accordance with embodiments of the present invention.

With reference to FIGS. 4 and 5, a computing resource 110 as described above can include a housing 116 that is formed to define an aperture 117 and the system 101 of FIG. 1 can further include, for each cable 321 and each computing resource 110, a locking element 401. Here, each cable 321 can include the plug 320, a connector body 3201 and a receiving feature 3202. The connector body 3201 can extend outwardly and laterally from the plug 320 and the receiving feature 3202 can extend forwardly from the connector body 3201. With this or a similar construction, when the plug 320 is inserted into the plug receiver 310, the receiving feature 3202 is correspondingly inserted into the housing 116 through the aperture 117. In accordance with embodiments of the present invention, the receiving feature 3202 can be formed as an elongate element with a notch 3203 (see FIG. 6) at a distal end thereof.

Figure 6:
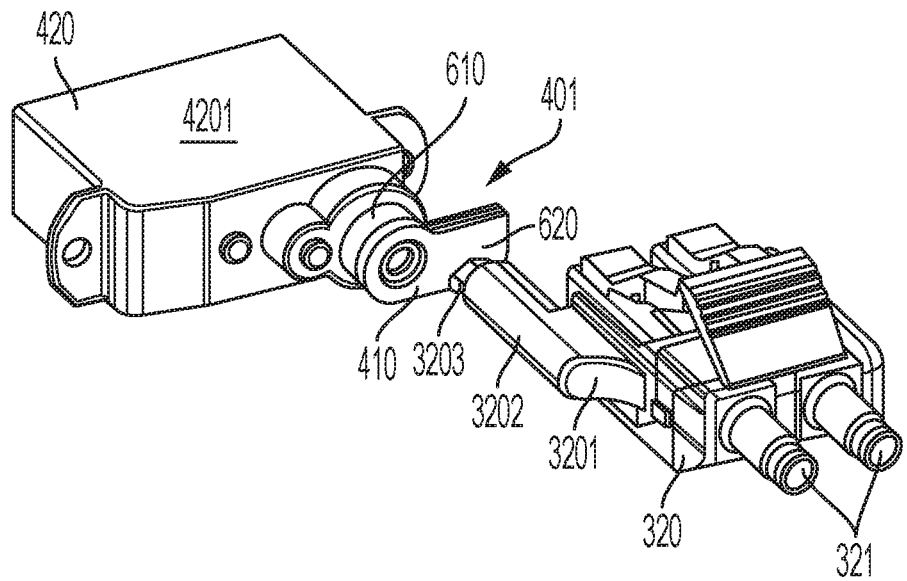
FIG. 6 is an enlarged perspective view of the locking element of FIGS. 4 and 5 in accordance with embodiments of the present invention.

With continued reference to FIGS. 4 and 5 and with additional reference to FIG. 6, the locking element 401 includes a locking feature 410 and an actuator 420. The locking feature 410 is configured to assume a locked condition or an unlocked condition. In the locked condition, the locking feature 410 engages with the notch 3203 of the plug 320 of the cable 321 such that the cable 321 is locked to the computing resource 110 and cannot be unplugged. Alternatively, in the locked condition, the locking feature 410 blocks passage of the receiving feature 3202 through the aperture 117 such that the locking feature 410 effectively prevents the plug 320 of the cable 321 from being inserted into the plug receiver 310 of the computing resource 110. In the unlocked condition, the locking feature 410 disengages from the notch 3203 of the plug 320 of the cable 321 such that the cable 321 is unlocked from the computing resource 110 and can be unplugged. Alternatively, in the unlocked condition, the locking feature 410 permits passage of the receiving feature 3202 through the aperture 117 such that the locking feature 410 effectively permits the plug 320 of the cable 321 to be inserted into the plug receiver 310 of the computing resource 110.

The actuator 420 is coupled to the locking feature 410 and is configured to control the locking feature 410 to assume the one of the locked and unlocked conditions. In accordance with embodiments of the present invention, the actuator 420 can be provided as a linear actuator or as a rotary actuator 4201 as shown in FIG. 6. In the case of the actuator 420 being provided as the rotary actuator 4201, the rotary actuator 4201 can include an output shaft 610 and a physical locking feature 620. The physical locking feature 620 is coupled to the output shaft 610 and includes one or more of a latch 621 that is configured for engagement with the receiving feature 3202 of the cable 321 (to either lock the cable 321 in place or to prevent insertion of the cable 321) and a pin configured for insertion into the receiving feature 3202. In the former case, the rotary actuator 4201 is configured to rotate the output shaft 610 in first and second opposite directions whereby the latch 621 is rotationally moved into or out of locking and unlocking positions with respect to the notch 3203.

As shown in FIGS. 4 and 5, the locking feature 410 and the actuator 420 can be disposed within an interior of the housing 116. It is to be understood, however, that this is not required and that embodiments exist in which at least one of the locking feature 410 and the actuator 420 are disposed at an exterior of the housing 116 (see FIGS. 15 and 16 and accompanying text below). Where the actuator 420 is disposed within the interior of the housing 116, the actuator 420 can be disposed on a printed circuit board (PCB) 421. This PCB 421 can include various processing elements and can generate commands for operating the actuator 420 whereby the actuator 420 is receptive of commands from the PCB 421.

With continued reference to FIG. 6 and with reference back to FIGS. 2 and 3, one or more of the SP 202 and one or more of the CPs 203 of each drawer 201 of each computing resource 110 can be configured to cooperatively define or act as a controller 630. The controller 630 can be embodied as a generic hardware management console (HMC) 631, a generic service element (SE) 632 or as another suitable form. In any case, the controller 630 can be configured to define rules for users of the system 101 (see FIG. 1) where the rules are associated with respective IDs of each of the users and established criteria associated with each user for operating the locking elements 401. The rules can, for example, set forth times when one or more of the users of the system 101 are authorized to manipulate (i.e., unplug or plug in) one or more cables 321 relative to one or more computing resources 110. Thus, the controller 630 can cause locking features 410 of corresponding locking elements 401 to assume the unlocked conditions during those times. That is, the controller 630 effectively causes the locking feature 410 of each of the locking elements 401 to assume one of the locked and unlocked conditions in accordance with respective IDs of users and the criteria established for each user.

In accordance with embodiments of the present invention, the computing resource 110 can be provided as a server in which various systems management operations are executed via the HMC 631 and the SE 632. An example of such systems management operations is configuration management. This relates to techniques, resources and tools used to initialize, configure, customize and maintain hardware, including the input/output (I/O) resources (network, storage, etc.). Both the HMC 631 and the SE 632 can be configured with user management interfaces for a first set of users defined to the HMC 631 and a second set of users defined to the SE 632. The first and second sets of users have associated privilege levels that define what operations (or tasks) they are permitted to do with respect to the computing resource.

Figure 7:
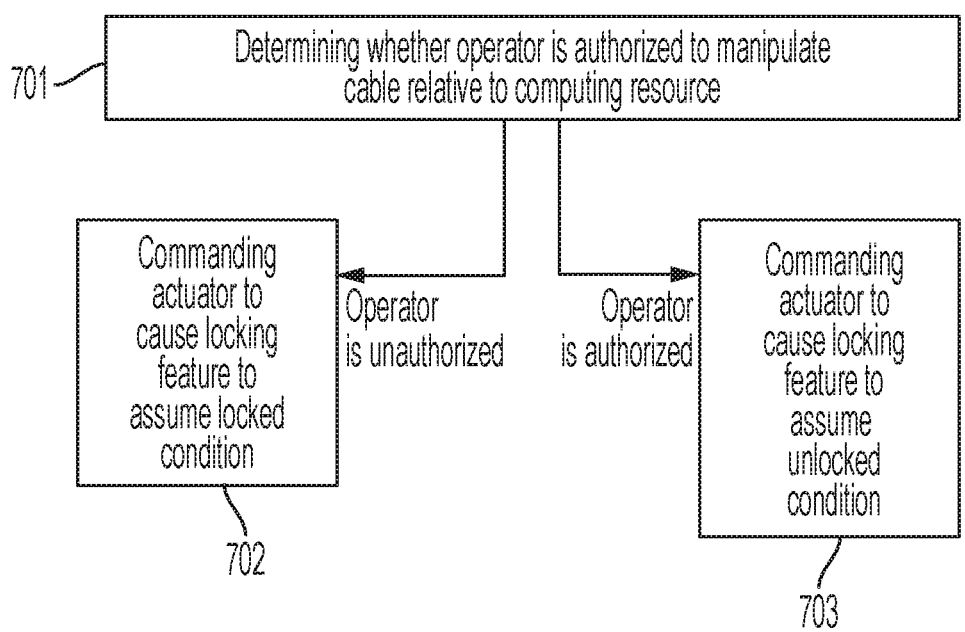
FIG. 7 is a flow diagram illustrating a method of operating a locking assembly of a computing resource in accordance with embodiments of the present invention.

With reference to FIG. 7, a method of operating a locking assembly of a computing resource, such as a computing resource 110 as described herein, is provided. The method includes operations that can be executed as an OS level or higher of the computing resource 110. As shown in FIG. 7, the method includes determining whether an operator is authorized to manipulate a cable relative to the computing resource (block 701). The method further includes commanding an actuator to cause a locking feature of a locking assembly to assume a locked condition to prevent the cable from being unplugged from or plugged into the computing resource in an event the determining indicates that the operator is unauthorized to unplug the cable from or to plug the cable into the computing resource (block 702). In addition, the method includes commanding the actuator to cause the locking feature of the locking assembly to assume the unlocked condition to permit the cable to be unplugged from or plugged into the computing resource in an event the determining indicates that the operator is authorized to unplug the cable from or to plug the cable into the computing resource (block 703).

In accordance with exemplary embodiments of the present invention, "HMC users" and "SE users" can be defined to have rules associated to their user IDs that would lock or unlock a cable based on the "cable criteria" associated with each of them. For example, an "HMC user," admincasey, can be permitted to remove or insert cables for a certain card for a certain computing resource between certain hours of the day, Friday through Sunday. This "HMC user," admincasey, is not permitted to remove or insert cables into other cards for the certain computing resource at any other time or day of the week. Furthermore, the "HMC user," admincasey, is not permitted to remove or insert cables into any other physical port, in any other computing resource. Thus, when the "HMC user," admincasey, successfully logs in to the HMC 631 on Saturday at 4 AM, he or she will be able to successfully issue a cable command to unlock the cable locks for which he or she is authorized. However, if the "HMC user," admincasey, issues a cable command to unlock any other cable in any other location, the cable lock will not unlock because he or she is not permitted to unlock or lock those cables. Similar schemes can be used for the SE users.

Modern software systems often rely heavily upon various authentication methods to mitigate security risks and data integrity issues. Traditional embodiments of this concept exist strictly within the software domain protecting assets such as account numbers, passwords and other sensitive information. To gain access to these assets, there are a wide variety of techniques such as PINs, passwords, encryption and biometrics. Existing implementations, such as accessing a locked mobile device, will pass identification information through to the underlying OS or security product to authenticate the user to the desired resource.

Figure 8:
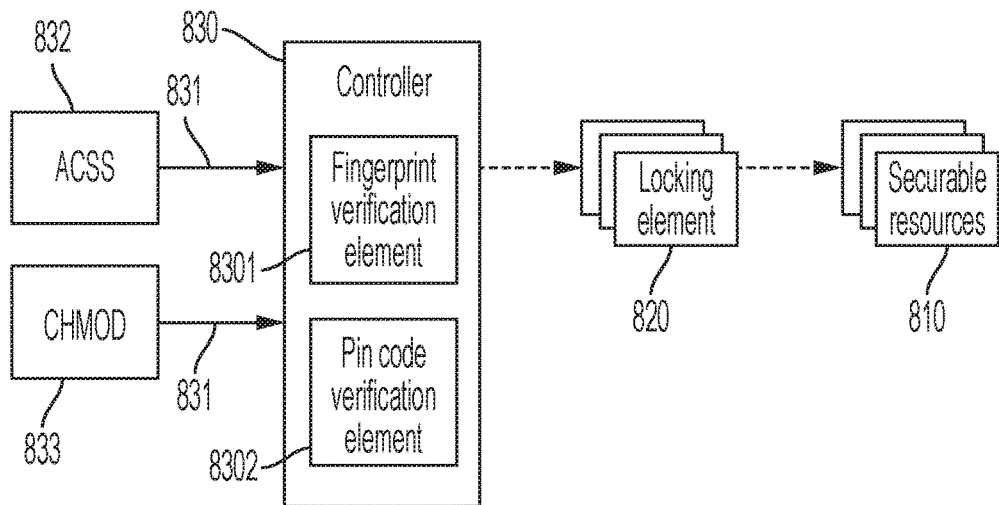
FIG. 8 is a schematic illustration of a system of computing resources in accordance with embodiments of the present invention.

With reference to FIG. 8, a system 801 is provided and can include one or more securable resources 810, such as computing resources or a safes or some other similar elements, locking elements 820 similar to the locking element 401 described above and a controller 830 similar to the controller 630 described above. The controller 830 is receptive of an instruction 831 to authorize users to unlock one or more of the one or more securable resources 810. The controller 830 is further configured to perform OS level authentication of the users and OS level control of the one or more locking elements 401 in accordance with the instruction 831 to authorize users and the OS level authentication.

As shown in FIG. 8, the instruction 831 is received from an external communication and can be received via one or more of an access control system or service (ACSS) interface 832 and a change mode (CHMOD) interface 833. The instruction 810 can be one of time sensitive and condition dependent. The OS level authentication of the users can be performed by the controller 830 performing one or more of fingerprint and pin code OS level authentication at fingerprint and pin code verification elements 8301 and 8302. The OS level control of the one or more locking elements 82 can be performed by the controller 830 whereby the controller 830 causes the one or more locking elements 820 to assume the respective unlocked conditions in accordance with a requesting user being authorized by the instruction 831 to authorize users and being authenticated by the OS level authentication by the controller 830.

An example of the system 801 of FIG. 8 can be seen in a physical lock on a safe which is controlled and monitored through software based mitigation systems as noted above. All requests to access the resources within the safe would need to be registered and authenticated before the attempt would be approved or denied. If a user wished to unlock the safe, they would need to pass proper identification, such as a fingerprint, PIN code, etc., to the controlling OS which would then evaluate the information and open the lock should the user possess the correct authority. This notion can be extrapolated to other physical resources as well including input/output (I/O) ports, storage devices and communication cards. An employee in a company may be granted temporary authority to add or remove devices. This authority can be time sensitive to limit access to only during the employee's shift or during emergencies such as a system outage or other critical situation. An administrator or other authorized user would be required to authorize these users via standard interfaces in the controlling operating system such as ACSS or CHMOD. Having additional physical information protection will prevent and mitigate unauthorized access from malicious users and disgruntled employees trying to cause physical harm to a set of resources or attempting to steal information.

Figure 9:
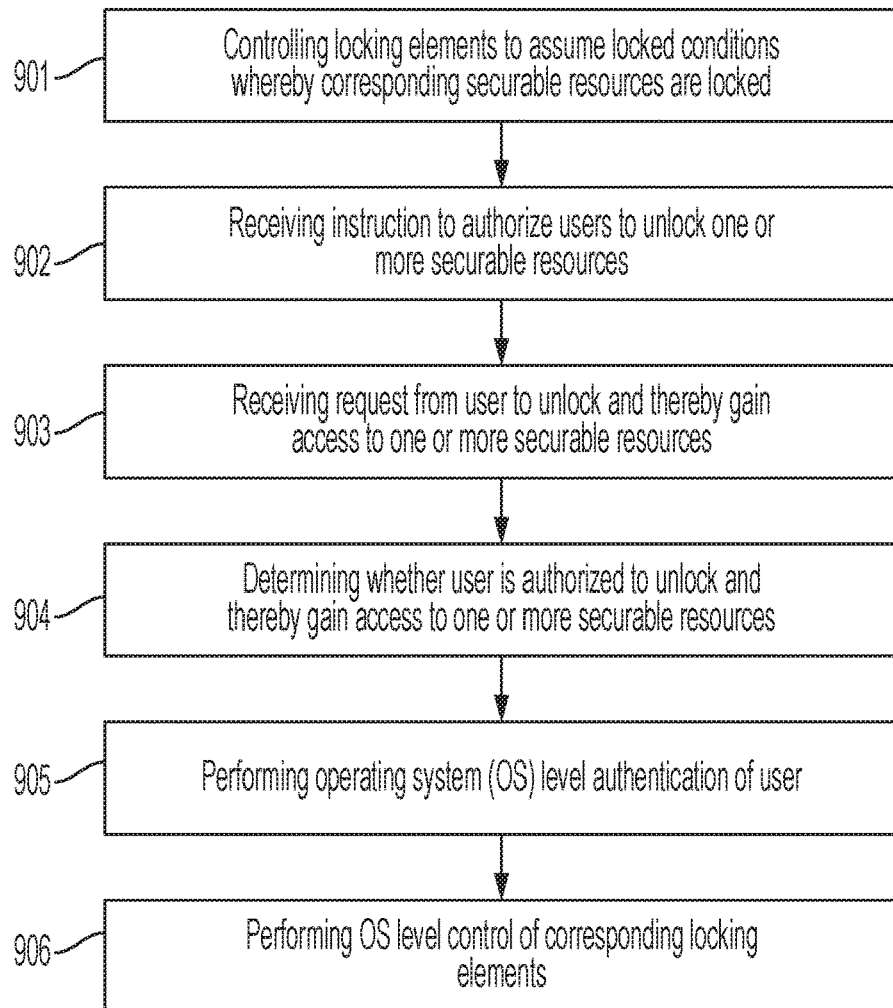
FIG. 9 is a flow diagram illustrating a method of operating the system of FIG. 8 in accordance with embodiments of the present invention.

With reference to FIG. 9, a method of operating a system, such as the system 801 of FIG. 8, is provided. As shown in FIG. 9, the method includes controlling locking elements to assume locked conditions whereby corresponding securable resources are locked by the locking elements (block 901), receiving an instruction to authorize users to unlock one or more of the securable resources (block 902) and receiving a request from a user to unlock and thereby gain access to one or more of the securable resources (block 903). The method further includes determining whether the user is authorized to unlock and thereby gain access to the one or more of the securable resources associated with the request (block 904), performing operating system (OS) level authentication of the user (block 905) and performing OS level control of the corresponding locking elements in accordance with the user being determined to be authorized and authenticated (block 906).

As demand for content and services continues to grow, more machines and resources are utilized in data centers and other computing centers. A common problem in these areas is having machines fail and necessitate that a replacement be installed and configured quickly to maintain availability to the end customer. As machines are added and removed to a large network of devices working in unison, wires and cables are needed to enable proper communications. During maintenance and updates to these machines, sometimes the incorrect wire is removed or one is added to an incorrect port causing outages, delays and other damages.

Figure 10:
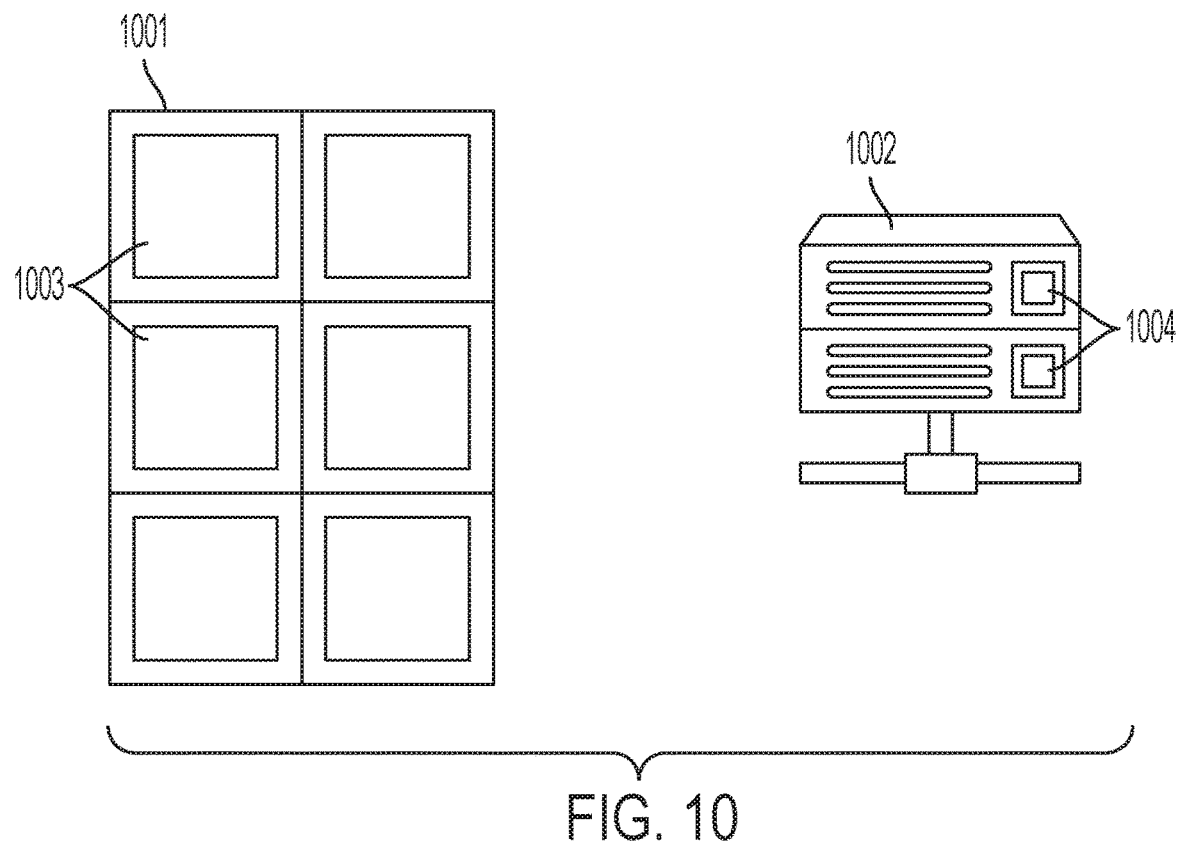
FIG. 10 is a schematic illustration of an expansion of the system of FIG. 8 in accordance with embodiments of the present invention.

Thus, with reference to FIG. 10, the system 801 of FIG. 8 can be expanded to include one or more resources, such as safes 1001 and computing resources 1002, where each of the one or more resources includes multiple independently securable resources, such as separate interiors 1003 of the safe 1001 and one or more of power and data communication cables which are insertable into ports, storage devices or communications cards 1004 of the computing resource 1002. In accordance with embodiments of the present invention, the instruction 831 (see FIG. 8) for the safe 1001 can relate to the locks of one or more but not necessarily all of the separate interiors 1003 and the instruction 831 (see FIG. 8) for the computing resource 1002 can similarly relate to one or more but not necessarily all of the various components of the computing resource 1002. In the cases of the resources of FIG. 10, the system 801 of FIG. 8 operates substantially similarly as described above.

In accordance with exemplary embodiments of the present invention, a physical access port on a securable resource can be guarded by physical locks and risk mitigation systems that can only be removed through the authorization of a software based system such as ACSS or CHMOD. A use case may be that a communication cable needs to be replaced between a server and communications router. A system administrator may authorize a specific user to remove a specific cable by unlocking only the required port on the server. This will prevent accidental or malicious disconnects from healthy communications on the server as physical locks or pins will restrict access to other resources and devices interfacing with the desired server. The result is an increase in reliability and security for devices operating within a test floor or data center where configurations are constantly changing and maintenance is always ongoing.

With increasing requirements for computing power and data storage, cloud providers are relying more and more on data centers that include a variety of tools and machines. Each unique tool or device usually requires a skilled technician or employee to manage and configure it for optimal use so customers receive reliable and secure services. A multitude of security measures are often implemented to prevent unauthorized access to sensitive resources. Each resource often has unique protections in place that users must authenticate against in order to manage the system. This generally leads to redundant authentication steps and lost time as an authorized employee must start the process over from scratch as they jump between systems to perform required maintenance.

Figure 11:
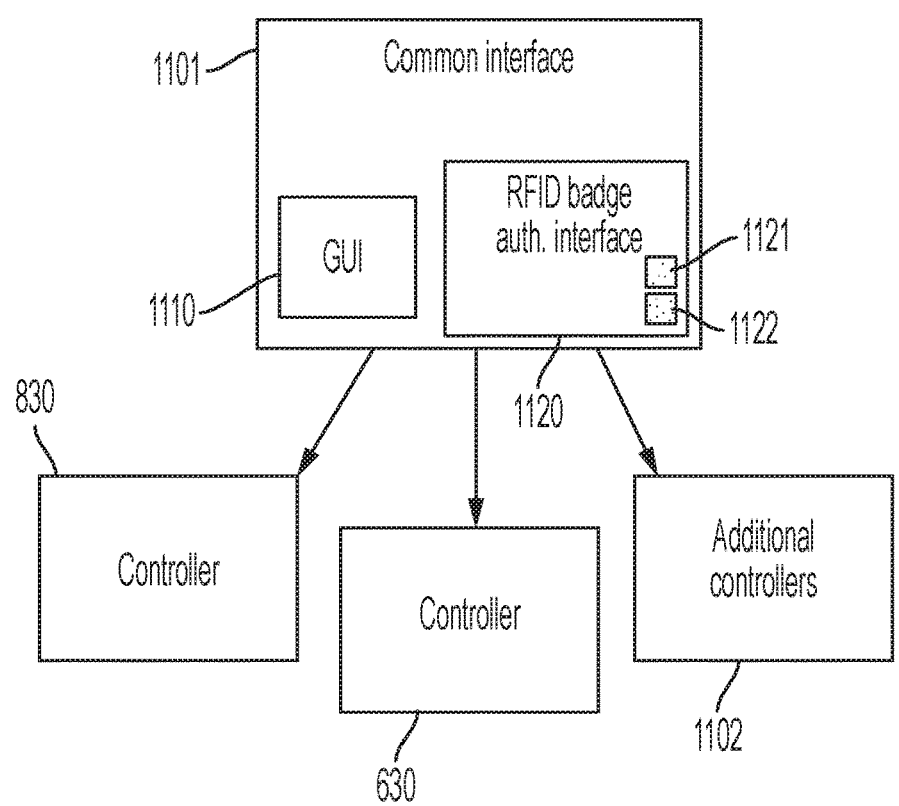
FIG. 11 is a schematic diagram of a system including a common interface in accordance with embodiments of the present invention.

With reference to FIG. 11, a common interface 1101 can be provided for use with the controller 630 or the controller 830 described above as well as additional controllers 1102, which are separate and independent from the controller 630 or 830 and one another. The controller 630 or 830 and the additional controllers 1102 are tied to the common interface 1101 and the common interface 1101 is configured to authenticate the users. To this end, the common interface 1101 can be embodied in a hypervisor or a multiplexer and can include one or more of a graphical user interface (GUI) 1110 and a physical authentication interface 1120 that, in turn, can include one or more of an RFID badge authentication interface 1121 and a fingerprint identification device 1122. In these or other cases, the controller 630 or 830 is configured to perform OS level control of locking elements in accordance with at least an authentication of the users by the common interface 1101.

Figure 12:
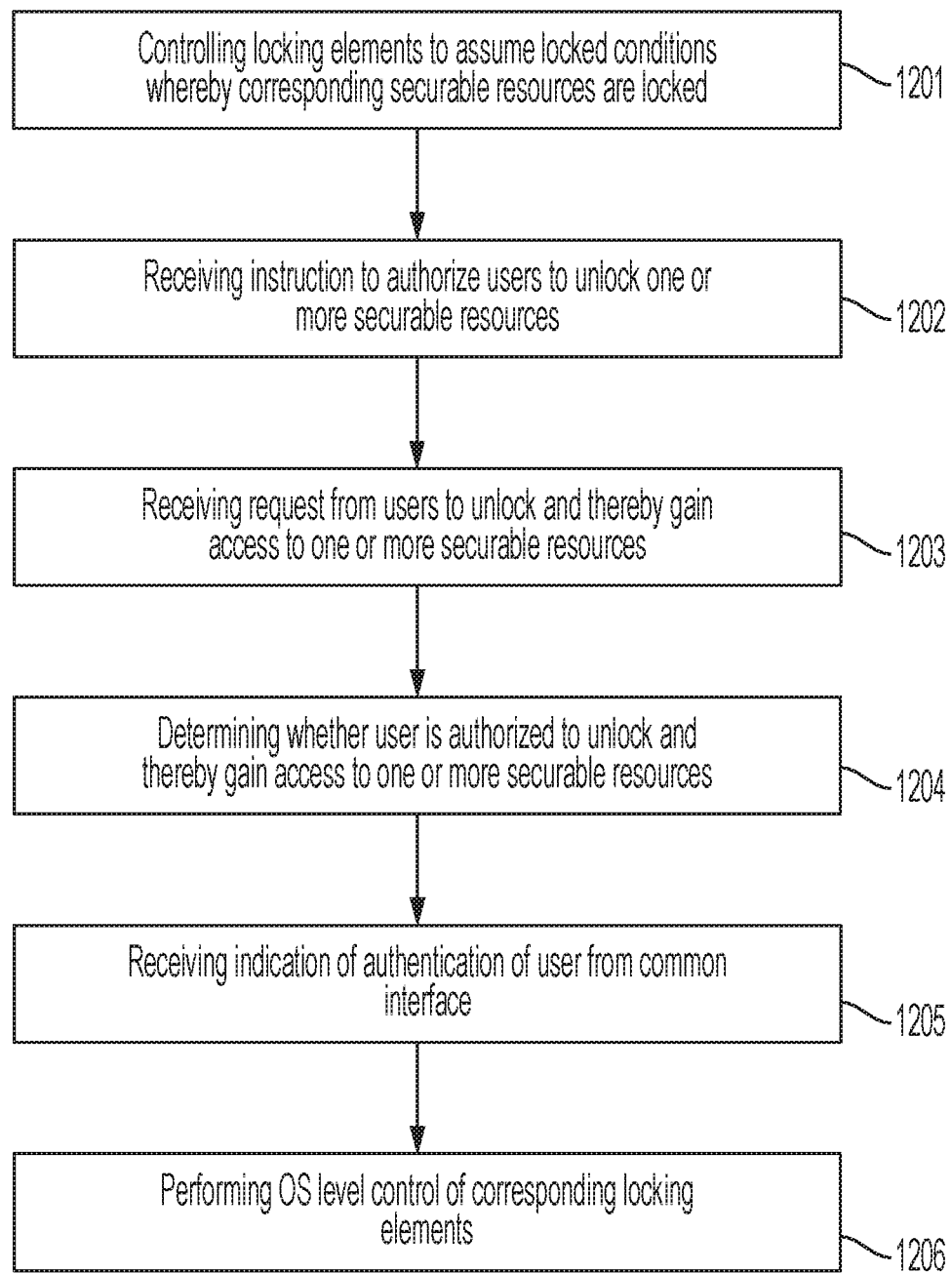
FIG. 12 is a flow diagram illustrating a method of operating a system with a common interface in accordance with embodiments of the present invention.

With reference to FIG. 12, a method of operating a system, such as system 101 of FIG. 1 or system 801 of FIG. 8 is provided. As shown in FIG. 12, the method includes controlling locking elements to assume locked conditions whereby corresponding securable resources are locked by the locking elements (block 1201), receiving an instruction to authorize users to unlock one or more of the securable resources (block 1202), receiving a request from a user to unlock and thereby gain access to one or more of the securable resources (block 1203) and determining whether the user is authorized to unlock and thereby gain access to the one or more of the securable resources associated with the request (block 1204). In addition, the method includes receiving an indication of authentication of the user from a common interface (block 1205) and performing OS level control of the corresponding locking elements in accordance with the user being determined to be authorized and the indication of the authentication of the user being received (block 1206).

The OS level authentication provided by to the common interface 1101 allows an authorized user to authenticate once to gain access to all necessary resources. This will, for example, allow a system administrator to perform maintenance on cables or communication devices that interface across multiple systems within the data center. If an unauthorized or disgruntled employee attempts to access resources, physical locks and security devices will prevent them from removing or altering cables and connections across these sensitive resources. Only authorized users will be allowed to rewire and maintain devices within the data center at the discretion of a system administrator.

Many devices are now incorporating hardware based authentication schemes to minimize vulnerabilities and security risks while accessing certain resources. Most modern mobile devices, for example, employ biometrics such as a fingerprint scanner or facial recognition software to authenticate specific users to the contents of the device. These metrics generally tend to interface with a security product to grant or deny access to specific software resources such as bank account information and other sensitive data. Many physical assets may also be protected by biometrics or other physical protections such as RFID badging. These systems tend to work off of standalone or proprietary validation systems which often times have delayed responses or simple work arounds such as tailgating through a badge locked door.

Figure 13:
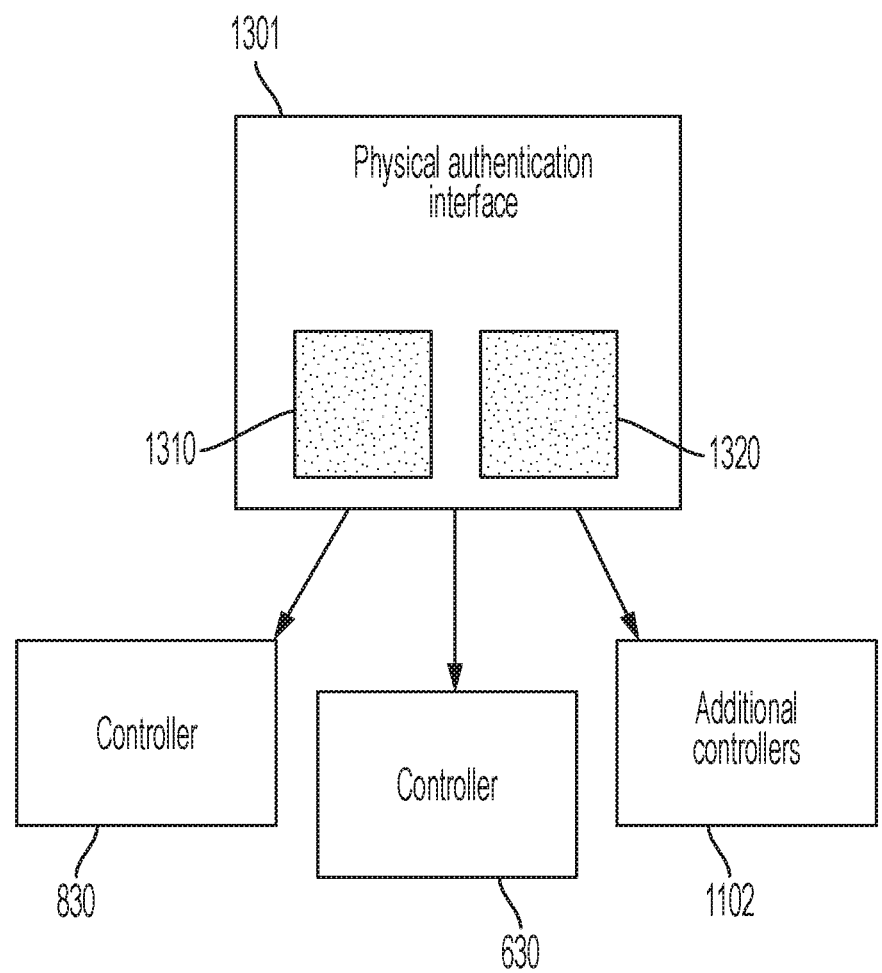
FIG. 13 is a schematic diagram of a system including a physical authentication interface in accordance with embodiments of the present invention.

With reference to FIG. 13, a physical authentication interface 1301 can be provided for use with the controller 630 or the controller 830 described above. In these or other cases, the physical authentication interface 1301 can be configured to enable or disable a capability of the controller 630 or 830 to perform the OS level authentication. In accordance with embodiments of the present invention, the physical authentication interface 1301 can include one or more of an RFID badge authentication interface 1310 and biometrics, such as a fingerprint identification device 1320.

Figure 14:
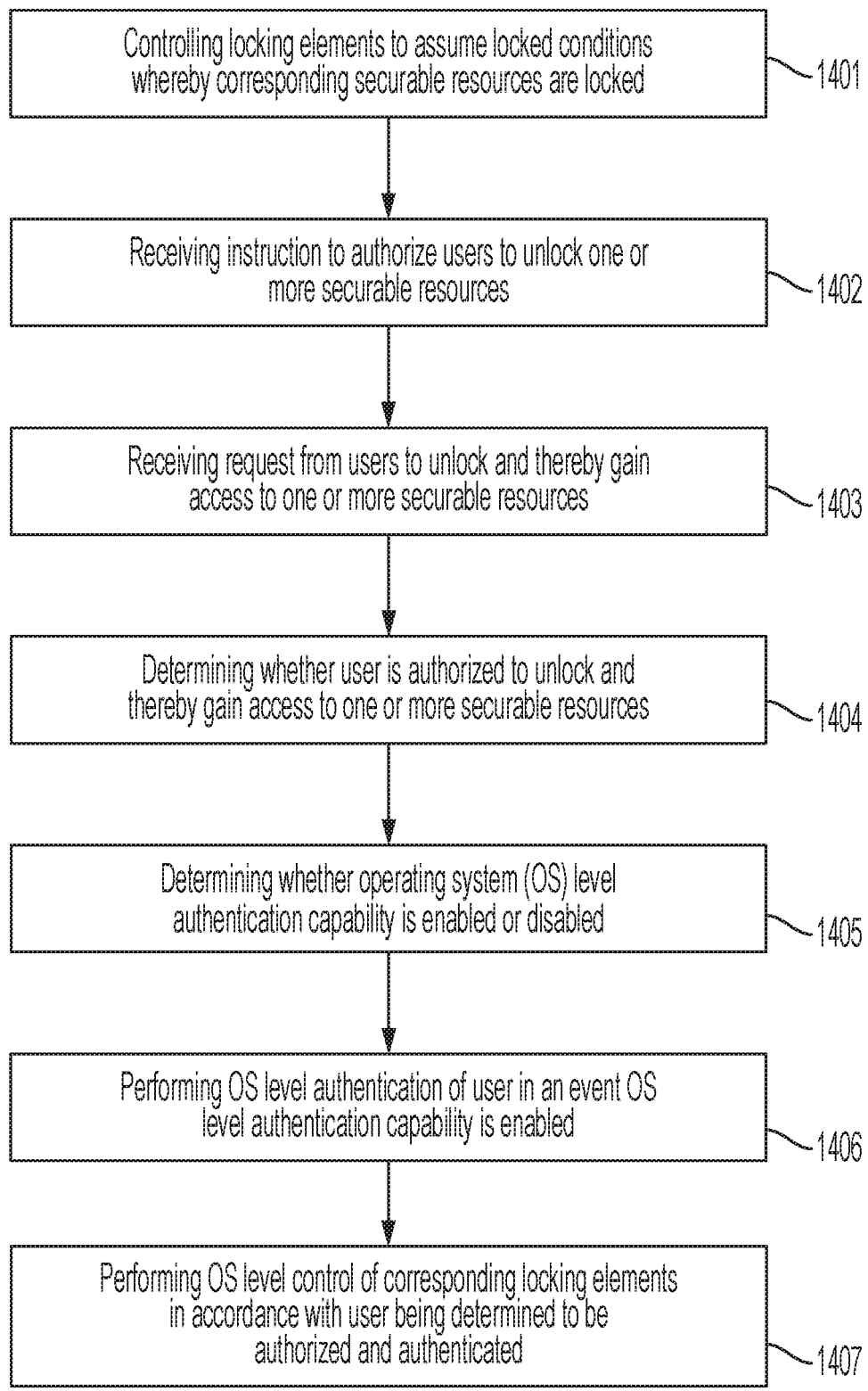
FIG. 14 is a flow diagram illustrating a method of operating a system with a physical authentication interface in accordance with embodiments of the present invention.

With reference to FIG. 14, a method of operating a system, such as system 101 of FIG. 1 or system 801 of FIG. 8 is provided. As shown in FIG. 14, the includes controlling locking elements to assume locked conditions whereby corresponding securable resources are locked by the locking elements (block 1401), receiving an instruction to authorize users to unlock one or more of the securable resources (block 1402), receiving a request from a user to unlock and thereby gain access to one or more of the securable resources (block 1403) and determining whether the user is authorized to unlock and thereby gain access to the one or more of the securable resources associated with the request (block 1404). In addition, the method includes determining whether OS level authentication capability is enabled or disabled by, for example, receiving an indication thereof from a physical authentication interface (block 1405), performing the OS level authentication of the user in an event the OS level authentication capability is enabled (block 1406) and performing OS level control of the corresponding locking elements in accordance with the user being determined to be authorized and authenticated (block 1407).

Figure 15:
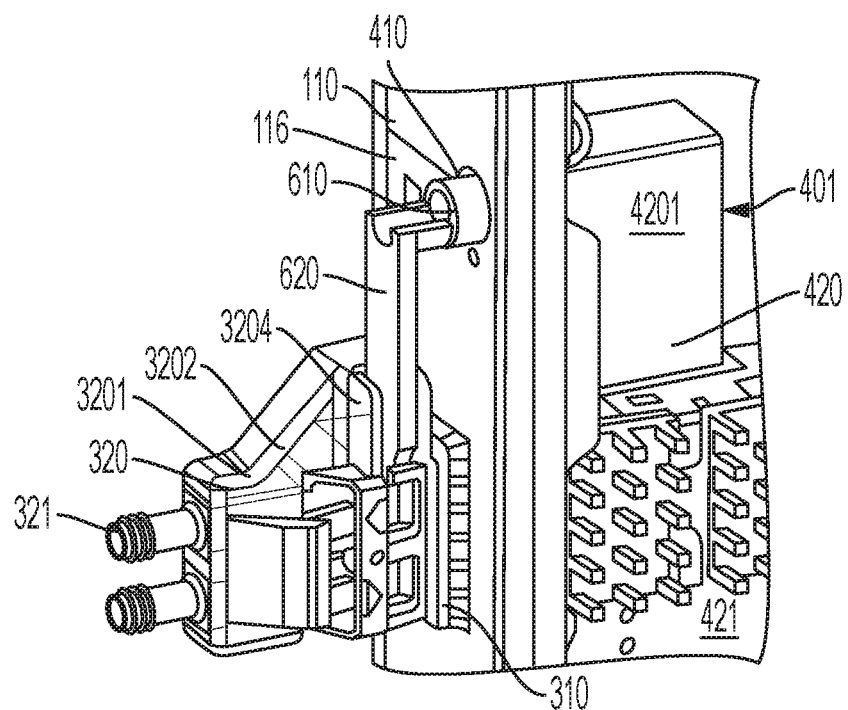
FIG. 15 is a perspective view of a cable and a locking element of computing resources in accordance with embodiments of the present invention.
Figure 16:
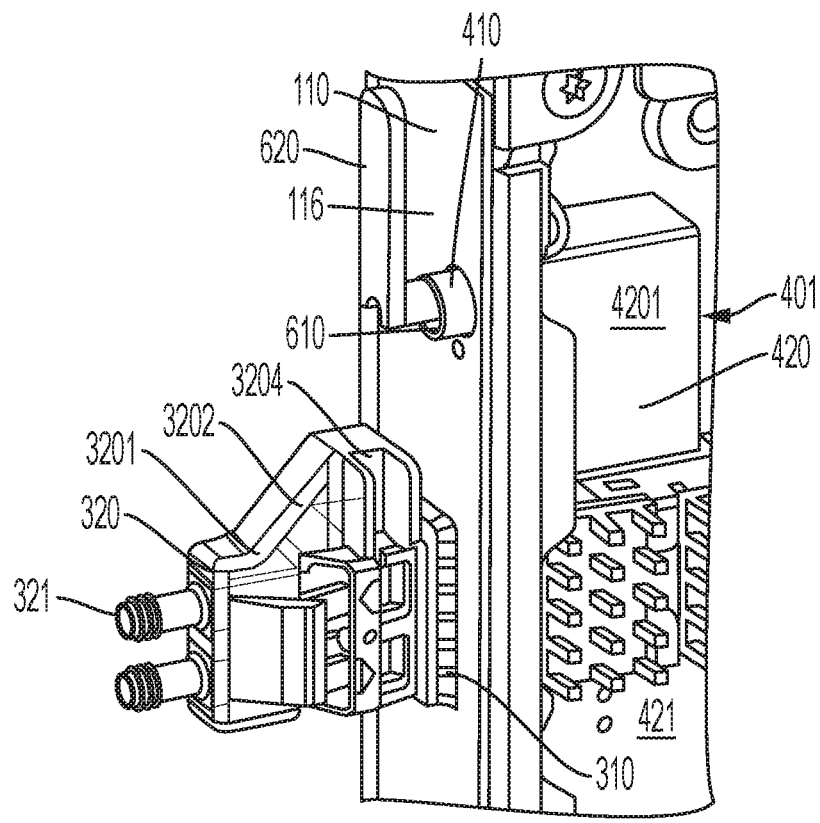
FIG. 16 is another perspective view of the cable and the locking element of FIG. 15 in accordance with embodiments of the present invention.

With reference to FIGS. 15 and 16 and, in accordance with embodiments of the present invention, at least one of the locking feature 410 and the actuator 420 can be disposed at an exterior of the housing 116. Here, again, each cable 321 can include the plug 320, the connector body 3201 and the receiving feature 3202. The connector body 3201 can extend outwardly and laterally from the plug 320 and the receiving feature 3202 can be formed as a pocket 3204. With this or a similar construction, when the plug 320 is inserted into the plug receiver 310, the receiving feature 3202 is disposed adjacent to an exterior facing surface of the housing 116. The locking feature 410 is configured to assume a locked condition or an unlocked condition. In the locked condition, the locking feature 410 engages with the pocket 3204 such that the cable 321 is locked to the computing resource 110 and cannot be unplugged (see FIG. 15). Alternatively, in the locked condition, the locking feature 410 blocks passage of the receiving feature 3202 such that the locking feature 410 effectively prevents the plug 320 from being inserted into the plug receiver 310. In the unlocked condition, the locking feature 410 disengages from the pocket 3204 such that the cable 321 is unlocked from the computing resource 110 and can be unplugged (see FIG. 16). Alternatively, in the unlocked condition, the locking feature 410 permits passage of the receiving feature 3202 such that the locking feature 410 effectively permits the plug 320 to be inserted into the plug receiver 310.

The actuator 420 is coupled to the locking feature 410 and is configured to control the locking feature 410 to assume the one of the locked and unlocked conditions. In accordance with embodiments of the present invention, the actuator 420 can be provided as a linear actuator or as a rotary actuator 4201 as shown in FIGS. 15 and 16. In the case of the actuator 420 being provided as the rotary actuator 4201, the rotary actuator 4201 can include an output shaft 610 that extends to an exterior of the housing 116 and a physical locking feature 620. The physical locking feature 610 is coupled to the output shaft 610 at the exterior of the housing 116 and is configured for engagement with the receiving feature 3202 of the cable 321 (to either lock the cable 321 in place or to prevent insertion of the cable 321). The rotary actuator 4201 is configured to rotate the output shaft 610 in first and second opposite directions to be rotationally moved into or out of locking and unlocking positions with respect to the pocket 3204.

Figure 17:
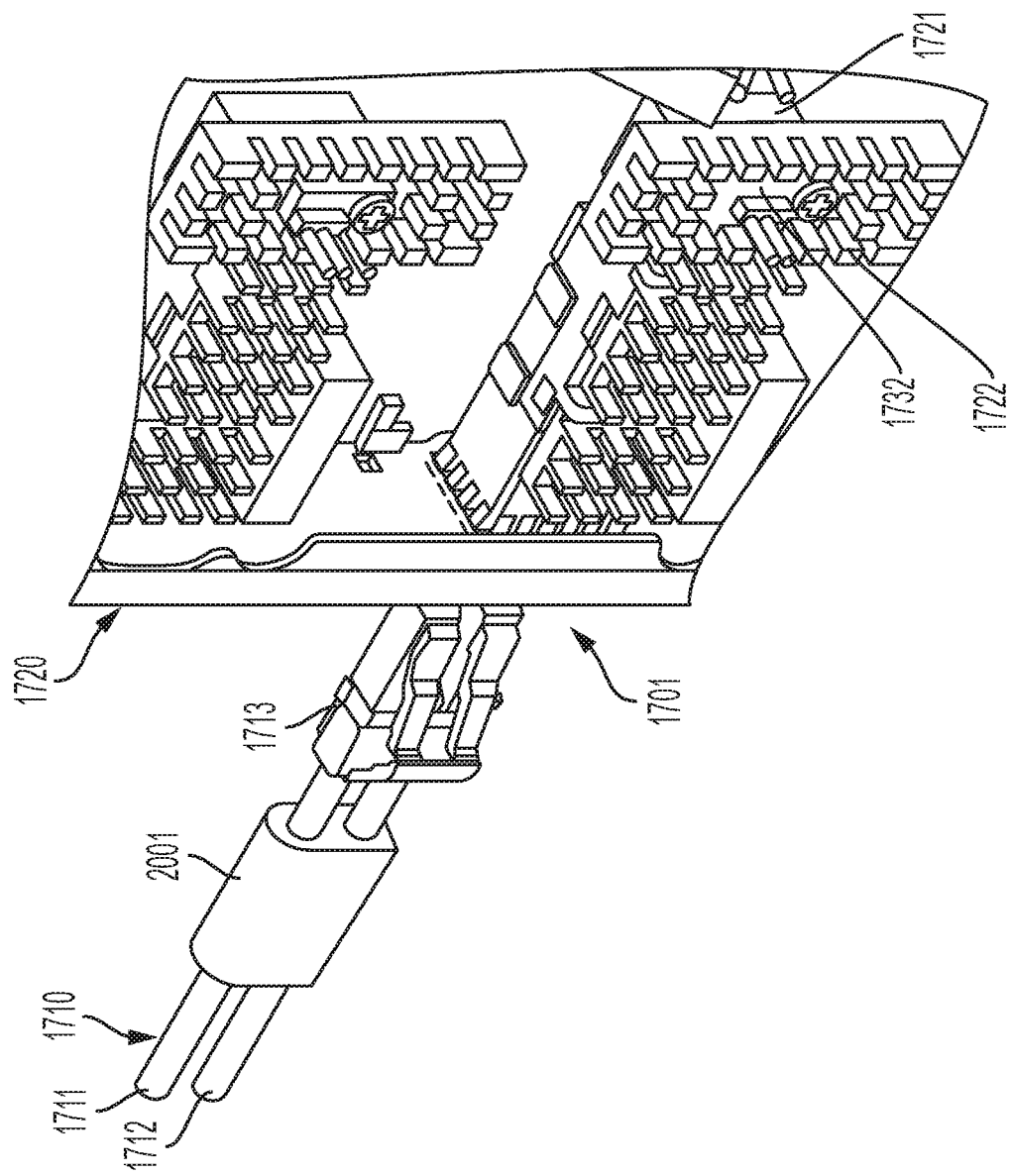
FIG. 17 is a perspective view of a cable assembly that can be plugged into an information technology (IT) device in accordance with embodiments of the present invention.
Figure 18:
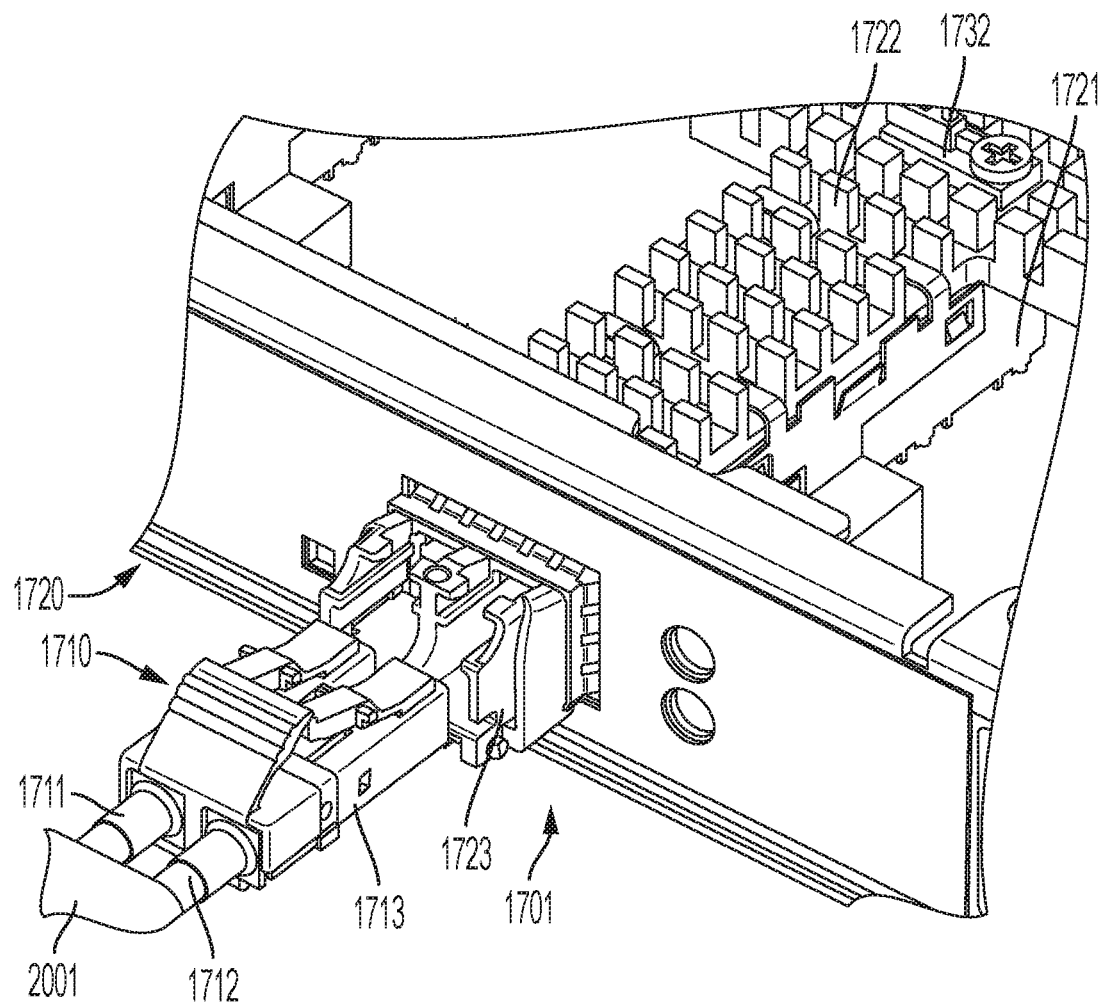
FIG. 18 is a perspective view of the cable assembly that can be plugged into an information technology (IT) device of FIG. 17 in accordance with embodiments of the present invention.

With reference to FIGS. 17 and 18, an information technology (IT) device assembly 1701 is provided and includes a cable assembly 1710 and an IT device 1720. The cable assembly 1710 can include a cable element, such as first cable 1711 and second cable 1712 (hereinafter, the cable element will be described as first cable 1711 and second cable 1712 for purposes of clarity and brevity), a plug element 1713 to which respective terminal ends of the first and second cables 1711 and 1712 are connected and which is configured to be plugged into a plug receptor (to be described below). The IT device 1720 can include or be provided as a computing resource 110 (see FIGS. 1-5 and the accompany text above) and can include, but is not limited to, computers, servers, Internet of Things (IOT) devices, mobile devices (e.g., tablets, smartphones, laptops, etc.), networking switches, etc. In any case, the IT device 1720 includes a printed circuit board (PCB) 1721, a heat sink 1722 that is supportively coupled to the PCB 1721 and a plug receptor 1723. The plug receptor 1723 is connected to the PCB 1721 and is receptive of the plug element 1713.

The IT device 1720 can further include at least one of a first sensor 1731 (see FIG. 20), a second sensor 1732 (the following description will relate to the case in which the IT device 1720 includes both the first and second sensors 1731 and 1732 for purposes of clarity and brevity) and an analysis engine 1740. The first sensor 1731 can be provided as a component of the cable assembly 1710 and can be disposed on or near the respective terminal ends of the first cable 1711 and the second cable 1712. The second sensor 1732 can be disposed on the heat sink 1722. Each of the first and second sensors 1731 and 1732 can be configured to sense a manipulation of the first and second cables 1711 and 1712 or the plug element 1713 relative to the plug receptor 1723 and to issue signals indicative of sensing results to at least the analysis engine 1740 accordingly.

In accordance with embodiments, the first and second sensors 1731 and 1732 can each include or be provided as an accelerometer or another similar sensing element.

Figure 19:
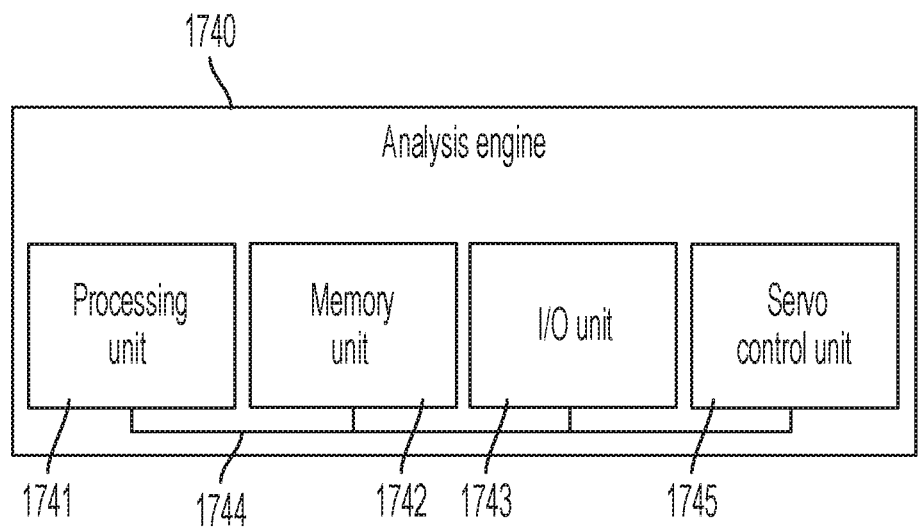
FIG. 19 is a schematic diagram illustrating components of an analysis engine in accordance with embodiments of the present invention.

With reference to FIG. 19, the analysis engine 1740 can include a processing unit 1741, a memory unit 1742, an input/output (I/O) unit 1743 disposed in signal communication with at least the first and second sensors 1731 and 1732 and a communications bus 1744 by which the processing unit 1741 is communicative with the memory unit 1742 and the I/O unit 1743. With such a configuration, the analysis engine 1740 is receptive of the signals issued by the first and second sensors 1731 and 1732 and is configured to analyze the signals against predefined rules/criteria-with-actions to determine a type of the manipulation of the first and second cables 1711 and 1712 or the plug element 1713 and to determine whether to take an action responsive to the manipulation. In cases where the action to be taken is a mechanical action (e.g., a locking or unlocking of the plug element 1713 from the plug receptor 1723 by features such as the locking feature 410 and the actuator 420 of FIG. 4 and the accompanying text), the analysis engine 1740 can further include a servo control unit 1745, which is communicative with the processing unit 1741 via the communications bus 1744, and which is operable by the processing unit 1741 to control operations of the locking feature 410 and the actuator 420.

In accordance with embodiments, the action can include at least one of issuing an alert, locking the plug element 1713 to or unlocking the plug element 1713 from the plug receptor 1723, ceasing transmissions between the plug element 1713 and the plug receptor 1723 and disabling computing resources of the IT device 1720.

The analysis engine 1740 can be provided as software that runs inside an embedded device (e.g., inside an IoT or other IT device, such as an Ethernet router), a stand-alone computing device or hardware appliance, as a software application that can run in general purpose operating systems or as a software application that runs in dedicated hardware or systems management stations (e.g., IBM Z Hardware Management Console, IBM Z Service Element, etc.).

Figure 20:
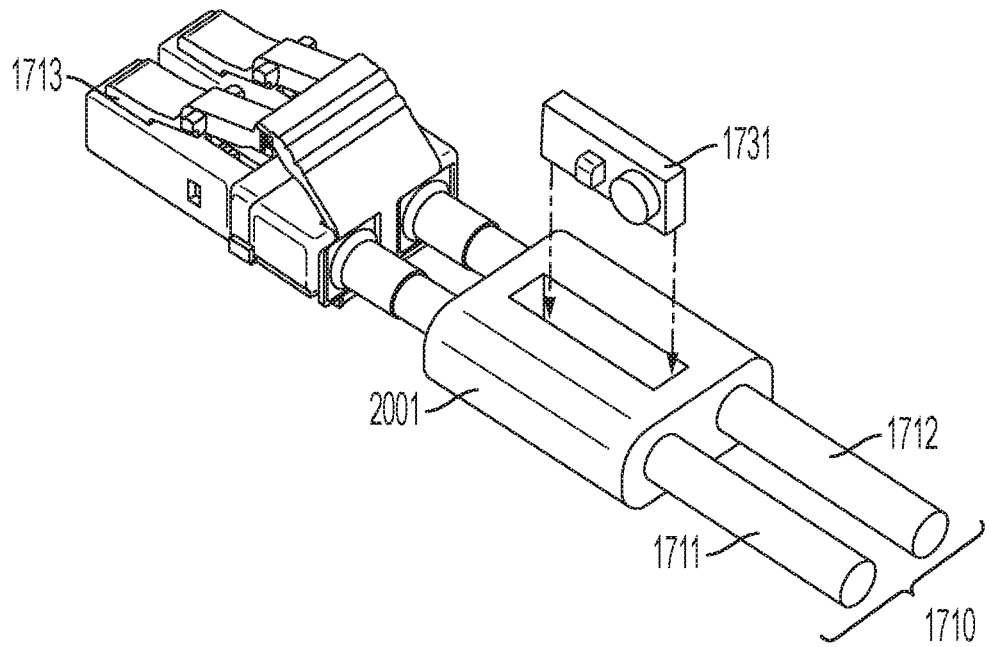
FIG. 20 is an exploded perspective view of components of the cable assembly of FIGS. 17 and 18 in accordance with embodiments of the present invention.

With reference to FIG. 20, the first sensor 1731 can be housed in a sensor body 2001 that is formed along the first and second cables 1711 and 1712 near to the respective terminal ends of the first and second cables 1711 and 1712. As used herein, the term "near" is analogous to "proximate" and refers to a distance D between an end of the sensor body 2001 and the plug element 1713 that is shorter than a length L of the sensor body 2001.

In accordance with embodiments of the present invention and as shown in FIG. 20, where the first sensor 1731 is housed in the sensor body 2001, the first sensor 1731 can be suspended between the first cable 1711 and the second cable 1712. Also, while the sensor body 2001 is illustrated in FIG. 20 as having an opening, it is to be understood that the first sensor 1731 can be fully encased within the sensor body 2001 and that the opening is illustrated to show the location of the first sensor 1731.

The signals issued by the first and second sensors 1731 and 1732 can include an identification of the plug receptor 1723 at which the manipulation in question occurs and data related to the sensing results (i.e., data that describes a physical component of the manipulation such as acceleration, time, rate of change of velocity, etc.). In any case, the signals can be transmittable via at least one of a wired network, such as Ethernet, FICON, etc., and a wireless network, such as WiFi, Bluetooth, etc.).

In an operational setting, in an event an unauthorized user attempts to pull the plug element 1713 out of the plug receptor 1723 in an accidental, mistaken or malicious act, the first and second sensors 1731 and 1732 will sense various accelerations of the cable assembly 1710 and the IT device 1720. For example, the unauthorized user might gain entry by himself to a data center in which the IT device 1720 is housed and once inside might jostle the plug element 1713 back and forth several times to loosen the connections. This jostling will be sensed as back and forth accelerations of the plug element 1713 and the heat sink 1722 which will be communicated to the analysis engine 1740 as the signals. The analysis engine 1740, knowing that the unauthorized user is present and alone in the data center, will then determine that an unauthorized attempt at a disconnection is underway by comparing the data of the signals to the predefined rules/criteria-with-actions and will subsequently determine the action to be taken as well as whether to actually take the action. In this case, the action to be taken could be to alert the responsible contact set forth in the rules/criteria-with-actions and/or to lock the plug element 1713 to the plug receptor 1723.

By contrast, in an event where an authorized user attempts to pull the plug element 1713 out of the plug receptor 1723 to conduct a proper inspection or repair but the plug element 1713 is locked to the plug receptor 1723, the authorized user might jostle the plug element 1713 in a similar manner as the unauthorized use. In this case, the first and second sensors 1731 and 1732 will again sense various accelerations of the cable assembly 1710 and the IT device 1720 that will be communicated to the analysis engine 1740 as the signals. The analysis engine 1740, knowing that the authorized user is permitted to pull the plug element 1713 out of the plug receptor 1723, will then determine that an authorized attempt at a disconnection is underway as above and will subsequently determine the action to be taken as well as whether to actually take the action. In this case, the action to be taken could be to unlock the plug element 1713 from the plug receptor 1723.

Figure 21:
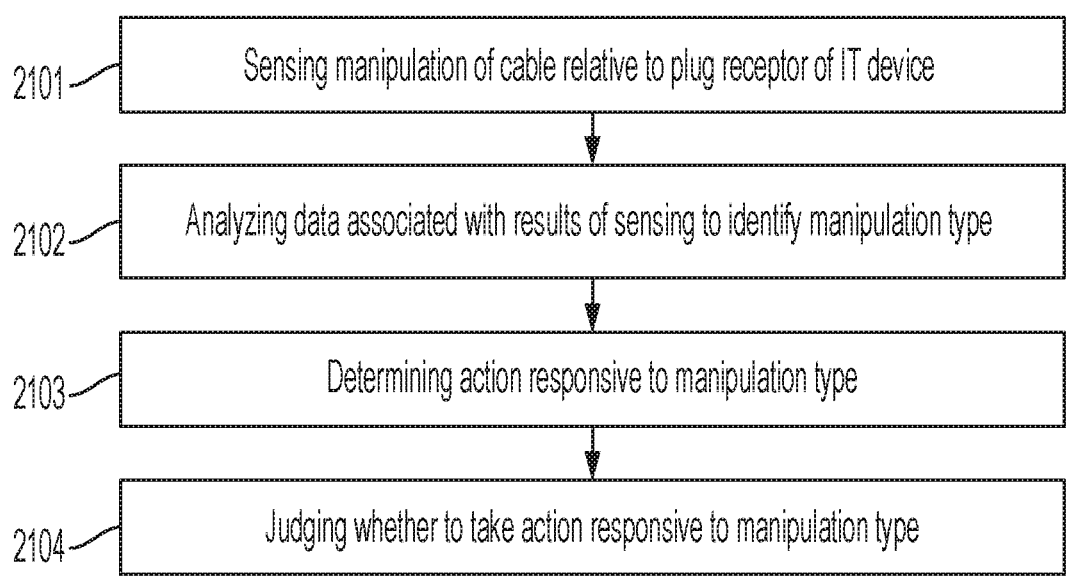
FIG. 21 is a flow diagram illustrating a method of detecting movement of a cable in a physical port of an information technology (IT) device in accordance with embodiments of the present invention.

With reference to FIG. 21, a method of detecting cable movement in a physical port of an information technology (IT) device is provided. As shown in FIG. 21, the method includes sensing a manipulation of a cable relative to a plug receptor of the IT device (2101), analyzing data associated with results of the sensing to identify a type of the manipulation (2102), determining an action responsive to the type of the manipulation (2103) and judging whether to take the action responsive to the type of the manipulation (2104).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A cable assembly, comprising:
a cable element comprising a first cable with a terminal end and a second cable with a terminal end;
a plug element to which the terminal end of the first cable and the terminal end of the second cable is connected and which is configured to be plugged into a plug receptor;
a sensor disposed along the cable element or in the plug element and configured to sense a manipulation of at least one of the cable element and the plug element relative to the plug receptor and to issue signals indicative of sensing results; and
an analysis engine which is receptive of the signals and configured to analyze the signals to determine a type of the manipulation and to determine whether to take an action responsive to the manipulation,
wherein the sensor is housed between the first and second cables and along the first and second cables proximate to the plug element.

2. The cable assembly according to claim 1, wherein the sensor is housed in a sensor body formed along the first and second cables proximate to the plug element.

3. The cable assembly according to claim 1, wherein the sensor comprises an accelerometer.

4. The cable assembly according to claim 1, wherein the plug receptor is a component of an information technology (IT) device comprising a heat sink and a printed circuit board (PCB) on which the heat sink is disposed and to which the plug receptor is connected.

5. The cable assembly according to claim 4, wherein:
the cable assembly further comprises a second sensor disposed on the heat sink and configured to sense the manipulation of the at least one of the cable element and the plug element relative to the plug receptor and to issue second signals indicative of sensing results, and
the analysis engine is receptive of the signals and the second signals, and configured to analyze the signals and the second signals to determine the type of the manipulation and to determine whether to take the action responsive to the manipulation.

6. The cable assembly according to claim 1, wherein:
the signals comprise an identification of the plug receptor and data related to the sensing results, and
the signals are transmittable via at least one of a wired network and a wireless network.

7. The cable assembly according to claim 1, wherein the analysis engine analyzes the signals against predefined rules/criteria-with-actions.

8. The cable assembly according to claim 1, wherein the action responsive to the manipulation comprises at least one of issuing an alert, locking or unlocking the plug element to the plug receptor, ceasing transmissions between the plug element and the plug receptor and disabling computing resources.

9. An information technology (IT) device assembly, comprising:
a cable assembly;
an IT device comprising a printed circuit board (PCB), a heat sink coupled to the PCB and a plug receptor, the plug receptor connected to the PCB and receptive of a plug element of the cable assembly;
at least one of a first sensor disposed on the cable and a second sensor disposed on the heat sink, each of which is configured to sense a manipulation of the cable relative to the plug receptor and to issue signals indicative of sensing results; and
an analysis engine which is receptive of the signals and configured to analyze the signals to determine a type of the manipulation and to determine whether to take an action responsive to the manipulation.

10. The IT device assembly according to claim 9, wherein the first sensor is housed in a sensor body formed along the cable assembly proximate to the plug element and the second sensor is disposed on the heat sink.

11. The IT device assembly according to claim 9, wherein each of the first sensor and the second sensor comprises an accelerometer.

12. The IT device assembly according to claim 9, wherein:
the signals comprise an identification of the plug receptor and data related to the sensing results, and
the signals are transmittable via at least one of a wired network and a wireless network.

13. The IT device assembly according to claim 9, wherein the analysis engine is a component of the IT device.

14. The IT device assembly according to claim 9, wherein the analysis engine analyzes the signals against predefined rules/criteria-with-actions.

15. The IT device assembly according to claim 9, wherein the action responsive to the manipulation comprises at least one of issuing an alert, locking or unlocking the plug element to the plug receptor, ceasing transmissions between the plug element and the plug receptor and disabling computing resources of the IT device.

16. A method of detecting cable movement in a physical port of an information technology (IT) device comprising a heat sink and a printed circuit board (PCB) on which the heat sink is disposed, the method comprising:
sensing, by a sensor disposed on the heat sink, a manipulation of a cable relative to a plug receptor, which is provided as a component of the IT device and to which the plug receptor is connected, the sensor being configured to issue a signal indicative of sensing results; and
receiving the signal at an analysis engine, the analysis engine being configured to:
analyze data associated with results of the sensing to identify determine a type of the manipulation;
determine an action responsive to the type of the manipulation; and
judge whether to take the action responsive to the type of the manipulation.

17. The method according to claim 16, wherein the sensing by the sensor occurs at a location of the sensor along the cable proximate to the plug receptor.

18. The method according to claim 16, wherein the analyzing of the data comprises analyzing the data against predefined rules/criteria-with-actions.

19. The method according to claim 16, wherein the action responsive to the type of the manipulation comprises at least one of issuing an alert, locking or unlocking the plug element to the plug receptor, ceasing transmissions between the plug element and the plug receptor and disabling computing.

* * * * *